United States Patent

Shiomi

[11] Patent Number: 5,042,521
[45] Date of Patent: Aug. 27, 1991

[54] SWITCHING APPARATUS FOR SUCTION SYSTEM IN A VACUUM PUMP

[75] Inventor: Iwaji Shiomi, Tokyo, Japan
[73] Assignee: Nitto Kohki Co., Ltd., Tokyo, Japan
[21] Appl. No.: 635,302
[22] Filed: Dec. 28, 1990

[30] Foreign Application Priority Data

Jan. 19, 1990 [JP] Japan .................................. 2-10313

[51] Int. Cl.$^5$ ............................................. F04B 23/04
[52] U.S. Cl. ........................................ 137/118; 417/62
[58] Field of Search ..................... 137/109, 118; 417/62

[56] References Cited

U.S. PATENT DOCUMENTS

| | | | |
|---|---|---|---|
| 2,255,560 | 9/1944 | Fieber | 417/62 X |
| 2,377,556 | 6/1985 | Jeanin | 417/62 |
| 2,904,012 | 9/1959 | Hager | 417/62 X |
| 4,718,832 | 1/1988 | Takahashi | 417/62 X |

Primary Examiner—Alan Cohan
Attorney, Agent, or Firm—Kinney & Lange

[57] ABSTRACT

A piston and a plurality of passages (first to fourth or fifth passages) are provided in a cylinder for reciprocation, which piston has a recessed portion formed in the central part thereof, so that the suction system of two suction pumps can automatically be switched between a parallel coupling and a series coupling depending on the piston's position in the cylinder. The pressure in a pressure chamber provided adjacently to the cylinder is changed by means of a pilot valve provided so as to operate when the negative pressure of the pumps become a predetermined value, and the piston is moved between its first and second positions by means of a diaphragm which constitutes a part enclosure of the pressure chamber and deforms in response to the change of the pressure in the pressure chamber, thereby the suction system is switched from parallel to series or vice versa.

6 Claims, 5 Drawing Sheets

SWITCHING APPARATUS FOR SUCTION SYSTEM IN A VACUUM PUMP

BACKGROUND OF THE INVENTION

1. Field of the Invention

The present invention is related to an apparatus for switching the suction system in a vacuum pump, and particularly to an apparatus for switching the suction system in a vacuum pump, wherein two suction pump sections are connected in parallel at the initial start-up time to increase the suction amount and automatically switched to a series connection after a preset negative pressure has been reached to provide vacuum or a degree of reduced pressure near vacuum at a high speed or in a short time, whereby an efficient reduced or vacuum pressure can be obtained.

2. Description of the Prior Art

In the U.S. Pat. No. 4,718,832 specification, a double-pump unit is disclosed in which two pumps are united or ganged. Since the use of such pump unit allows the connection mode of suction inlet and discharge outlet of each pump to optionally be set to either series connection or parallel connection, the suction amount can be set in multiple stages when such pump unit is used as a suction pump, without causing so much loss of the energy of an a.c. power supplied to the stationary electromagnets of the pumps.

FIG. 4 is a schematic diagram showing a state in which first pump 1 and second pump 2 are connected in parallel, and FIG. 5 is a schematic diagram showing a state in which first pump 1 and second pump 2 are connected in series, wherein symbols 1A and 2A represent suction inlets and symbols 1B and 2B represent discharge outlets. If, in these figures, the pumps are assembled so that the axis of each piston of the respective pumps is positioned on a single straight line and the pistons move in the directions opposite to each other, the vibrations of the respective pumps offset each other, whereby the vibration and noise of the pump unit can be reduced.

FIG. 6 shows an example of the pump characteristics when two vacuum pumps having the same performance are connected in series and when they are connected in parallel. In the same figure, the abscissa axis is negative pressure while the ordinate axis is flow rate, and the solid line represents the series connection performance while the dotted line represents the parallel connection performance. The characteristics of a single vacuum pump is shown by the dashed line.

As shown in FIG. 6, if two pumps of the same performance are connected in series, the flow rate when the negative pressure is zero (open-to-atmosphere state) is the same as that of a single pump, but the pressure when the flow rate is zero (cut-off state) becomes lower than that of a single pump, that is, the negative pressure becomes more negative than when using the single pump. Conversely, if the two pumps are connected in parallel, the negative pressure when the flow rate is zero is same as that of the single pump, but the flow rate when the negative pressure is zero becomes approximately two times that of the single pump.

Accordingly, if, at the pressure (P1) at which the series connection performance line (solid line) and the parallel connection performance line (dotted line) are intersecting each other, the connection is switched so that the pumps are connected in parallel when the negative pressure is in the range from 0 through P1 and they are changed to a series connection when the negative pressure has become more negative than P1 (or the pressure has become lower than P1), then an extremely efficient operation is obtained.

In order to perform such operation, it is only needed to provide a pressure sensor for sensing the negative pressure P1, for instance, in the fluid passages of the pumps and operate electromagnetic valves or the like to switch the fluid passages. In the above described prior art, however, there is disclosed no means for automatically switching the suction system. If an attempt is made to add the sensor and the electromagnetic valves for switching the fluid passages to the pump unit of the above prior art and perform the parallel-series connection switching, a power supply is required to supply power to the electromagnetic valves and sensor to be added, so the construction becomes further complex.

SUMMARY OF THE INVENTION

The object of the present invention is to provide an apparatus for switching the suction system in a vacuum pump, wherein the switching of parallel-series connection can be automatically performed only by mechanical means without requiring any extra power supply, electromagnetic valves or the like.

In order to accomplish the above object, the present invention is characterized by providing a piston in a cylinder for reciprocation, which piston has a recessed portion formed in the central part thereof, providing a plurality of passages (first to fourth or fifth passages) in the cylinder so that the suction system of two suction pumps can automatically be switched between a parallel coupling and a series coupling depending on the piston's position in the cylinder, and changing the pressure of a pressure chamber provided adjacent to the cylinder by means of a pilot valve provided so as to operate when the negative pressure of the pumps becomes a predetermined value and, moving the piston between its first and second positions by means of a diaphragm which deforms in response to the pressure change, thereby switching the suction system from parallel to series or vice versa.

When the negative pressure of the pumps changes over the predetermined pressure, the pilot valve operates to cause the piston to slide, whereby the connections of the plurality of passages are switched in unison. Accordingly, if each of the fluid passages (discharge outlets and suction inlets) of the two pumps is connected to one of the plurality of passages, respectively, the connection states of the pumps are switched.

DETAILED DESCRIPTION OF THE PREFERRED EMBODIMENT

Figure 1:
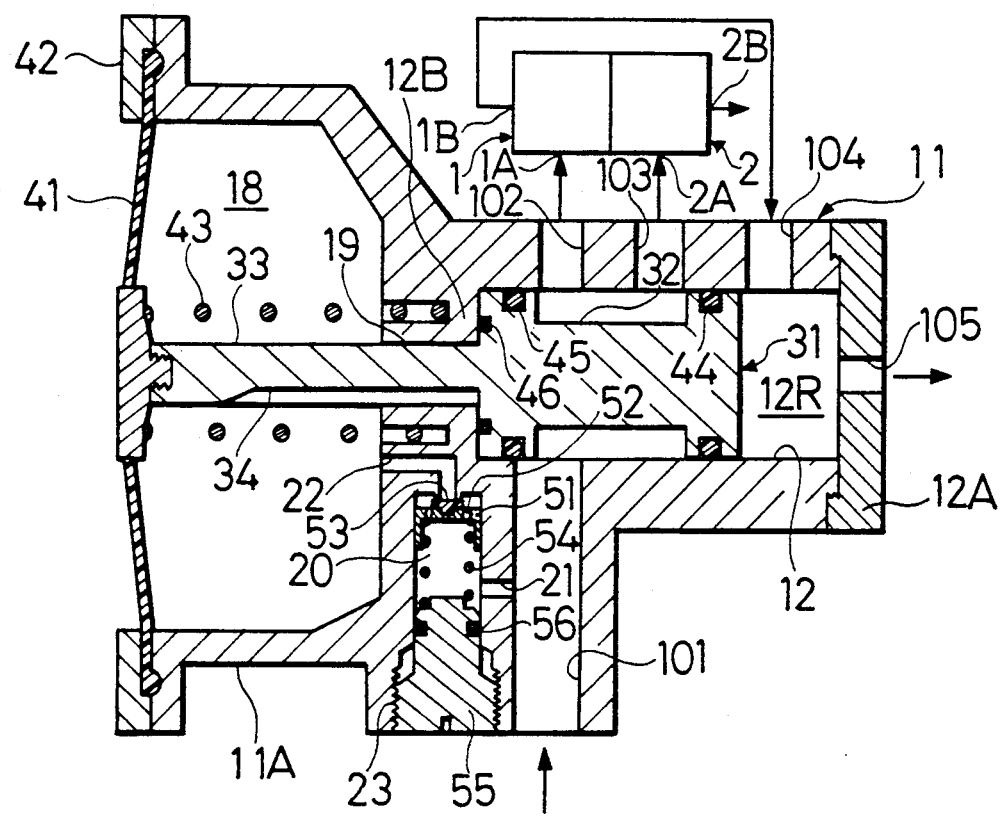
FIG. 1 is a longitudinally sectional side view showing an embodiment of the present invention.

FIG. 1 is a longitudinally sectional side view of the pump according to an embodiment of the present invention, in which a casing 11 includes its extended hollow cylindrical portion 11A which forms a pressure chamber 18 in cooperation with a diaphragm 41, and a cylinder 12 communicating with the pressure chamber 18 through a rod hole 19. The cylinder 12 includes a cylinder bottom member 12A. In the cylinder 12, a bobbin-shaped piston 31 is disposed which has a recessed portion 32 formed in the central part thereof, and a rod 33 attached to the front end face of the piston 31 or integrally formed therewith is projecting into the pressure chamber 18 through the rod hole 19 bored in a cylinder head 12B. In the rod 33, a groove portion 34 is formed from the root portion thereof to the pressure chamber 18. The top of the rod 33 is fixed to substantially the center of the diaphragm 41. The diaphragm 41 is attached to the casing portion 11A using a clamp ring 42 so as to close the pressure chamber 18 airtightly.

Between the bottom of the pressure chamber 18 and the top end of the rod 33 or diaphragm 41, a compression spring 43 is disposed for biasing the piston 31 in the left direction in FIG. 1. The piston 31 is urged by the compression spring 43 for piston restoration so as to abut the cylinder head 12B of the cylinder 12 at the pressure chamber 18 side, as shown in FIG. 1. By this abutment, an O-ring 46 attached to the piston 31 is closely contacted with the cylinder head of the cylinder 12 at the pressure chamber 18 side, and an O-ring 45 provided in the outer periphery of the piston 31 is closely contacted with the inner wall of the cylinder 12, so an airtight seal is provided between the pressure chamber 18 and the cylinder 12. A rear cylinder chamber 12R is defined between the piston 31 and the cylinder bottom 12A.

In the casing 11, a first passage 101, a second passage 102, a third passage 103 and a fourth passage 104 are formed in the cylinder wall so as to provide communication between the inner space of the cylinder 12 and the exterior of the casing 11. In the bottom member 12A of the cylinder 12 of casing 11 (the side remote from the pressure chamber 18), a fifth passage 105 is formed so as to provide communication between the rear chamber 12R and the outside of the casing 11. An O-ring 44 provided in the outer periphery of piston 31 at the end opposite to O-ring 45 is useful for an air tight shut off between the third passage 103 and the fourth passage 104 or between the fourth passage 104 and the fifth passage 105, which are provided at positions remote from pressure chamber 18 of cylinder 12.

Figure 3:
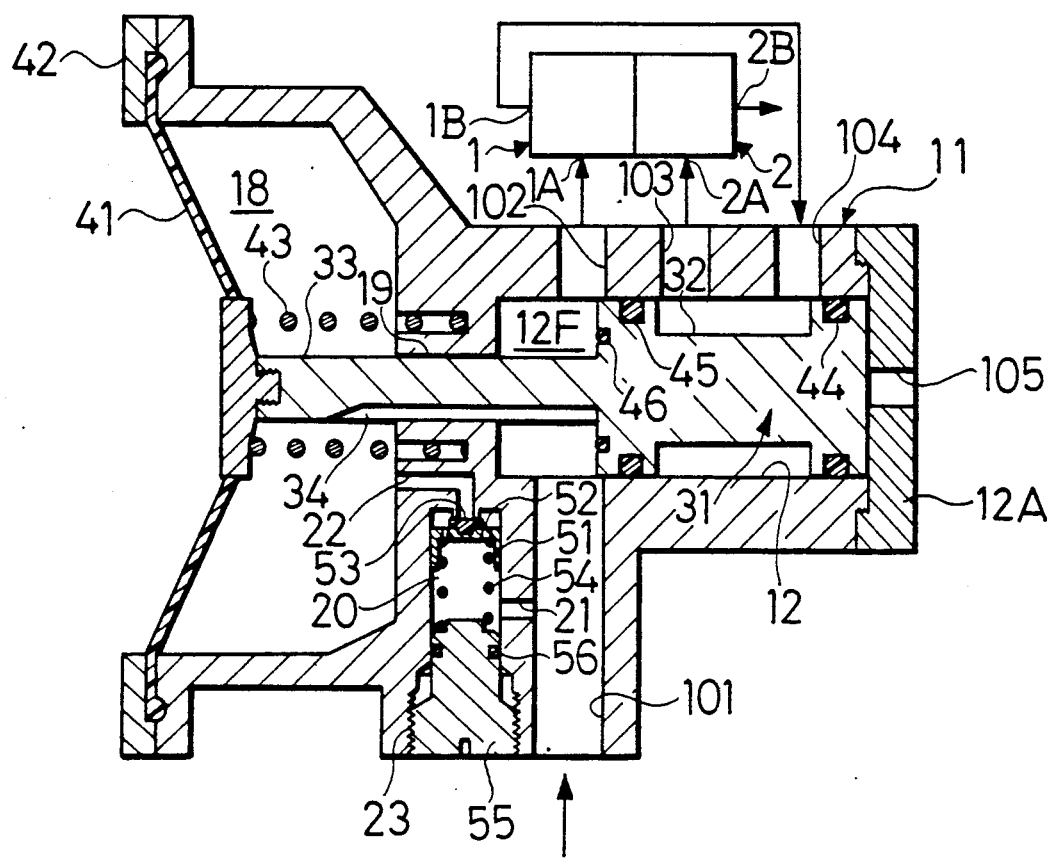
Figures 4, 5:
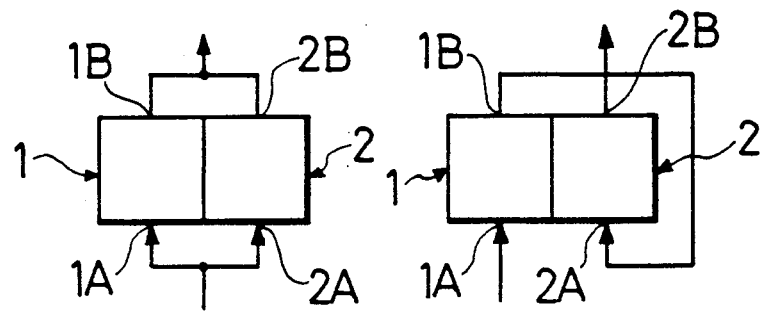
FIG. 4 is a schematic diagram showing a state in which two pumps are connected in parallel.
FIG. 5 is a schematic diagram showing a state in which two pumps are connected in series.

As seen from comparison of FIG. 1 with FIG. 3, the piston 31 can move from one end of the cylinder 12 at which the pressure chamber 18 is provided to the other end (the right end of the figures). At this time, a front cylinder chamber 12F is formed between the piston 31 and the cylinder head 12B as shown in FIG. 3.

The first and second passage 101 and 102 communicate with recessed portion 32 of the piston 31 if the piston 31 is positioned at the one end of the cylinder 12 adjacent the pressure chamber 18 (first position) as shown in FIG. 1, and they communicate with the pressure chamber 18 of the cylinder 12 through the groove 34 and the front cylinder chamber 12F if the piston 31 moves to the other end of the cylinder 12 opposite from the pressure chamber 18 (second position) as shown in FIG. 3.

The third passage 103 communicates with the recessed portion 32 of the piston 31 in both cases, that is, when the piston 31 is positioned at the one end of the cylinder 12 adjacent the pressure chamber 18 (FIG. 1) and when the piston 31 moves to the other end of the cylinder 12 opposite from the pressure chamber 18 (FIG. 3).

The fourth passage 104 communicates with the rear cylinder chamber 12R at the bottom side of the cylinder 12 if the piston 31 is positioned to the pressure chamber 18 end of the cylinder 12 (FIG. 1), and it communicates with the recessed portion 32 of the piston 31 if the piston 31 moves to the end opposite from the pressure chamber 18 (FIG. 3).

The fifth passage 105 communicates with the fourth passage 104 through the rear cylinder chamber 12R if the piston 31 is positioned at the end of the cylinder 12 adjacent the pressure chamber 18 (FIG. 1), and it is closed by the piston 31 if the piston 31 moves to the end of the cylinder 12 opposite from the pressure chamber 18 (FIG. 3).

Between the first passage 101 and the pressure chamber 18 of the casing 11, a pilot valve chamber 20 is formed which communicates with the first passage 101 via a communication path 21 and communicates with the pressure chamber 18 via a communication path 22. A pilot valve 51 is slidably disposed in the pilot valve chamber 20. The pilot valve 51 is normally biased by a spring 54 for pilot valve restoration so as to close the communication path 22, in other words, to close the opening of the pilot valve chamber 20 at the pressure chamber 18 side. A reference numeral 53 represents a packing for sealing the end of the communication path 22, a reference numeral 55 a spring presser which is screwed into a female thread 23 to support the spring 54 for pilot valve restoration, and a reference numeral 56 an O-ring.

The pilot valve 51 has a communication path 52 for the air vent purpose formed therein so that the blocking of the communication path 22 by the packing 53 is not prevented when the pilot valve 51 is in contact with the communication path 22, and so that communication is provided between the communication paths 21 and 22 when the pilot valve 51 is out of contact with the communication path 22.

In the embodiment of the present invention, a suction inlet 1A of a first pump 1 is connected to the second passage 102, a discharge outlet 1B of the first pump 1 is connected to the fourth passage 104, and a suction inlet 2A of a second pump 2 is connected to the third passage 103, as shown in FIG. 1.

If the first and second pumps 1 and 2 are simultaneously driven in this state of connection, the individual pumps suck the fluid in the vacuum container such as air from the suction inlets 1A and 2A via the first passage 101, the recessed portion 32 of the cylinder 12 (piston 31), and the second and third passages 102 and 103. On the other hand, the fluid is discharged to the outside from the discharge outlet 1B of the first pump 1 via the fourth passage 104, the rear cylinder chamber 12R and the fifth passage 105, and the fluid is directly discharged to the outside from a discharge outlet 2B of the second pump 2. That is, this connection state is a parallel connection.

If the driving of the first and secind pumps 1 and 2 is continued in the parallel driving state and the negative pressure of first passage 101 increases (the pressure of the first passage 101 is lowered) to a predetermined value, the pilot valve 51 blocking communication path 22 moves backward against the repulsive force of the spring 54 due to the pressure reduction in the pilot valve chamber 20, whereby the communication path 22 is opened. By this, the fluid in the pressure chamber 18 is introduced into the first passage 101 via the communication paths 22 and 52, the pilot valve chamber 20 and the communication path 21, and sucked by the first and second pumps 1 and 2, whereby the pressure in the pressure chamber 18 is reduced.

Figure 2:
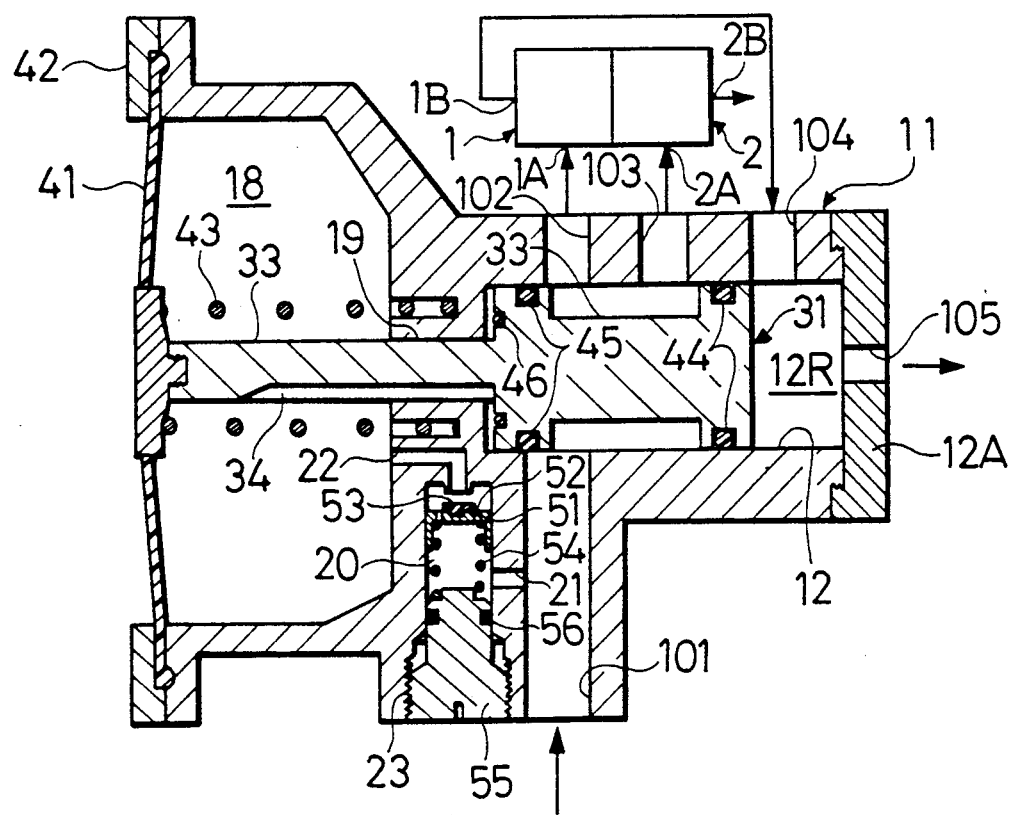
FIGS. 2 and 3 are sectional views similar to FIG. 1, wherein the operation of the embodiment is illustrated separately for the parallel suction and the series suction.

As a result, the piston 31 begins to move (backward) against the repulsive force of the compression spring 43 in the direction opposite to the pressure chamber 18, as shown in FIG. 2. When the O-ring 45 which seals the front end of piston 31 at the pressure chamber 18 side and the cylinder 12 is positioned on the opening in the cylinder wall of the first passage 101, the fluid in the pressure chamber 18 is also sucked through the groove portion 34 formed in the rod 33, and the front cylinder chamber 12F between the piston 31 and the inner wall of the cylinder 12. When the suction by the two pumps further proceeds and the front end portion of piston 31 at the pressure chamber 18 end reaches the second passage 102 and/or the first passage 101, the opening area of the fluid passage from the pressure chamber 18 to the suction inlet 1A rapidly increases, so the piston 31 instantaneously moves to the position in cylinder 12 shown in FIG. 3 which is at the end of cylinder 12 opposite from the pressure chamber 18 end.

For the piston position shown in FIG. 3, the openings of the third and fourth passages 103 and 104 on the inner surface of the cylinder 12 both communicate with the recessed portion 32, and the second and first passages 102 and 101 communicate with the front cylinder chamber 12F of the cylinder 12 at the pressure chamber 18 side. The fifth passage 105 is blocked by the piston 31 and the pilot valve 51 is restored to the initial position by the repulsive force of the spring 54. Obviously, this state is a series connection of the first and second pumps 1 and 2. The fluid in the vacuum container is sucked into the first pump 1 via the first passage 101, the front cylinder chamber 12F, the second passage 102, and the suction inlet 1A of the first pump 1, the fluid discharged from discharge outlet 1B of the first pump 1 flows into the suction inlet 2A of the second pump 2 via the fourth passage 104, the recessed portion 32 of the cylinder 12 (piston 31) and the third passage 103. And the fluid is directly discharged to the exterior from the discharge outlet 2B of the second pump 2.

Figure 6:
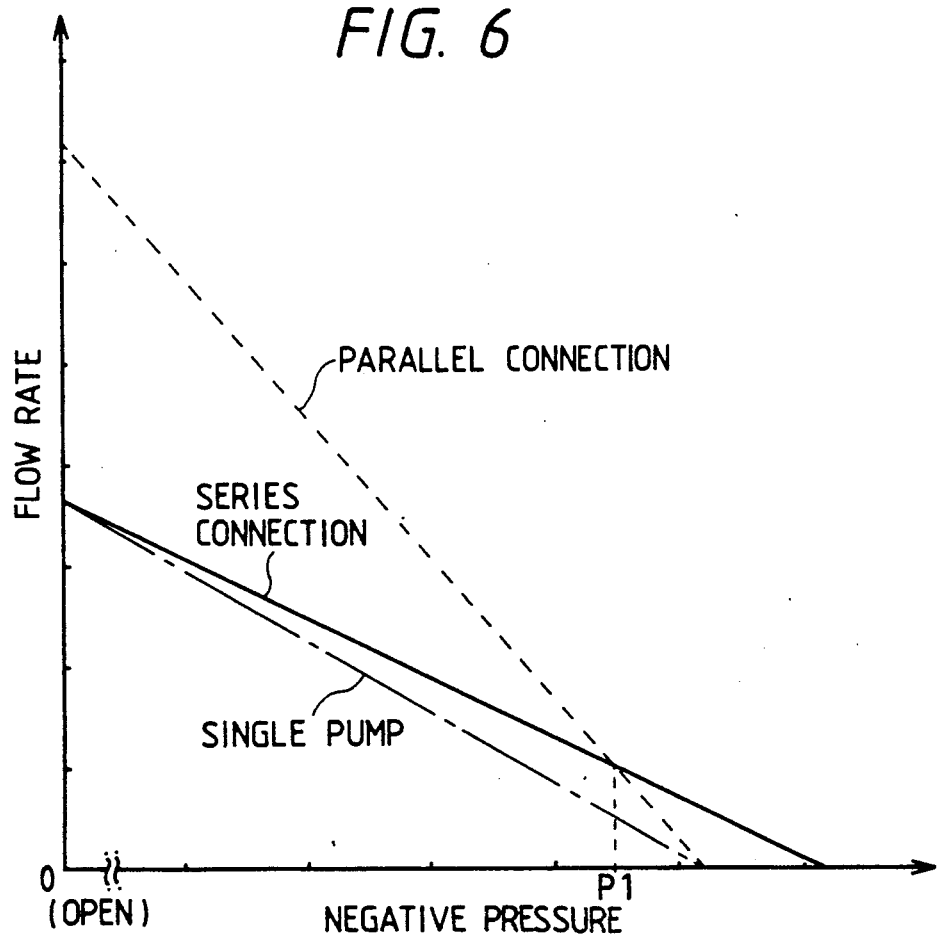
FIG. 6 is a graph showing the pump characteristics when two vacuum pumps of the same performance are connected in series and when they are connected in parallel, and the characteristics of a single pump.

As easily understood, if the repulsive force of the spring 54 is adjusted by rotating the spring presser 55 so that the pressure, when the pilot valve 51 slides from the closed position of FIG. 1 to the open position of FIG. 2, becomes substantially equal to the negative pressure P1 shown in FIG. 6, then a parallel operation is conducted for the negative pressure of 0 to P1, and a series operation is conducted when the negative pressure becomes more negative than P1. Thus, the switching of the fluid passages can accurately be made at a predetermined pressure (P1) by the repulsive force adjustment of the spring 54 for pilot valve restoration in the present embodiment.

In the state of FIG. 3, when the negative pressure in the first passage 101 or the pressure chamber 18 decreases, the piston 31 is allowed to slide toward the pressure chamber 18 by the repulsive force of compression spring 43, and the fluid passage switching apparatus is restored to the initial state.

Although it has been described in the foregoing that the compression spring 43 for piston restoration is disposed between the bottom of pressure chamber 18 and the diaphragm 41 or the top end of the rod 33, the compression spring 43 may be provided between the the piston 31 and the bottom or end of cylinder 12 opposite from the pressure chamber 18, or the compression spring 43 need not be provided if the diaphragm 41 itself has a repulsive force (restoration force) equivalent to that of the compression spring 43 for piston restoration.

Although it has been described that groove portion 34 for fluid passage is formed in the rod 33, this groove portion may be formed in and axially through the inside wall surface of the rod hole 19 instead of being formed in rod 33. In brief, it is only needed to form a communication path between the pressure chamber 18 and the front cylinder chamber 12F so that the two chambers are airtightly shut off when the piston 31 is in the position of FIG. 1 and they communicate with each other when the piston 31 is in the position of FIG. 2 or 3.

Although it has been described that the repulsive force of the spring 54 for pilot valve restoration is adapted to be adjusted by rotating the spring presser 55, means for adjusting the repulsive force of the compression spring 43 for piston restoration may instead be provided. Since the latter construction can easily be created by those skilled in the art, the description thereof is omitted.

Figure 7:
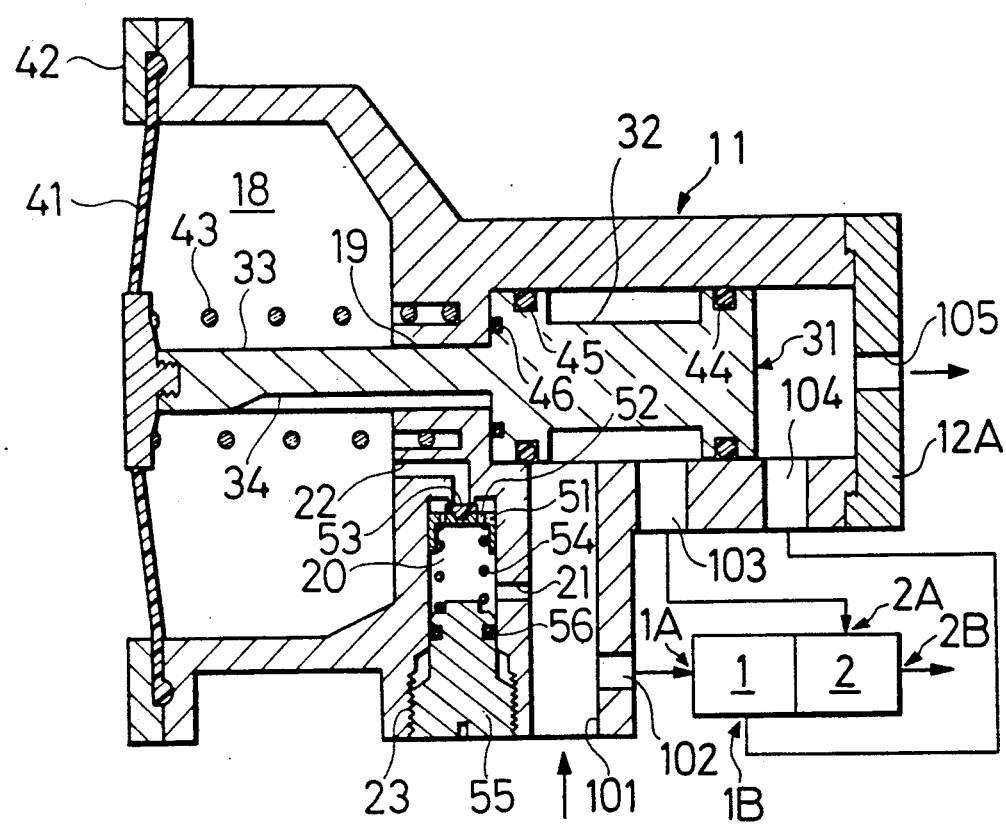
FIG. 7 is a sectional view showing a further embodiment of the present invention.

The pilot valve chamber 20 may be provided so that the second passage 102 and the pressure chamber 18 can communicate with each other. In FIG. 7, a further embodiment of the present invention is shown in which the first and second passages are directly connected. The other constructions and operations are the same as the first embodiment in FIG. 1.

The present invention may be applied to a double vacuum pump system as described in the above-mentioned U.S. Pat. No. 4,718,832 specification, or may be applied to any cases where two vacuum pumps are used in a pair.

As apparent from the above description, the following effects can be accomplished by the present invention.

(1) Since the switching of parallel-series connection is automatically performed depending on the negative pressure level, a suction operation using two pumps becomes extremely effective. In addition, since no extra power supply or electromagnetic valve is required and the switching of parallel-series connection is achieved only by mechanical means, the construction of the fluid passage switching apparatus for a vacuum pump is simplified.

(2) Since the restoration timing of the piston can be adjusted, the switching of the fluid passages, when the pressure is increased, can accurately be performed with a predetermined pressure P1 as a boundary point.

(3) Since the operation timing of the pilot valve can be adjusted, the switching of the fluid passages, when the pressure is decreased, can accurately be performed with a predetermined pressure P1 as a boundary point.

What is claimed is:

1. An apparatus for switching the suction system for a vacuum pump comprising:
   a bobbin-shaped piston having a recessed portion of a small diameter formed in the central part thereof and being provided with a rod projecting from one end thereof, a casing consisting of a cylinder for receiving the piston which has a cylinder bottom member and a cylinder head, and a hollow cylindrical portion provided adjacent to the cylinder head side, a rod hole bored through the cylinder head and having the rod passing through, a diaphragm which airtightly seals an opening end of the hollow cylindrical portion to form a pressure chamber in the casing and which is fixed to the rod passing through the rod hole, the piston being capable of reciprocating within the cylinder, forming a rear cylinder chamber between the cylinder bottom member and the piston when the piston is in a first position near the pressure chamber, and forming a front cylinder chamber between the cylinder head and the piston when the piston is in a second position remote from the pressure chamber, a fluid passage for allowing the pressure chamber and the front cylinder chamber to communicate with each other, said fluid passage being blocked by the piston when the piston is in the first position, a first passage bored in the cylinder wall being adapted to be coupled with a vacuum container, communicating with the recessed portion of the piston when the piston is in the first position, and on the other hand communicating with the front cylinder chamber when the piston is in the second position, a second passage bored in the cylinder wall being adapted to be coupled with a suction inlet of a first pump, communicating with the recessed portion of the piston when the piston is in the first position, and on the other hand communicating with the front cylinder chamber when the piston is in the second position, a third passage bored in the cylinder wall being adapted to be coupled with a suction inlet of a second pump, and communicating with the recessed portion of the piston, a fourth passage bored in the cylinder wall being adapted to be coupled with a discharge outlet of the first pump, communicating with the rear cylinder chamber when the piston is in the first position, and on the other hand communicating with the recessed portion of the piston when the piston is in the second position, a fifth passage bored in a wall of the rear cylinder chamber of the cylinder so as to be opened to the atmosphere, said fifth passage being blocked when the piston is in the second position, a pilot valve chamber communicating with at least one of the first and second passages and with the pressure chamber, and a pilot valve disposed in the pilot valve chamber for normally airtightly sealing the pressure chamber from at least one of the first and second passages, and on the other hand, when the pressure at least at said one of the first and second passages becomes lower than the pressure in the pressure chamber by a predetermined value, releasing the airtightly sealing to allow at least the said one of the first and second passages and the pressure chamber to communicate with each other.

2. The apparatus for switching the suction system for a vacuum pump of claim 1, wherein the fluid passage for allowing the pressure chamber and the front cylinder chamber to communicate with each other is formed in at least one of the external surface of the rod and the internal surface of the rod hole, and is blocked by the piston when the piston is in the first position.

3. The apparatus for switching the suction system for a vacuum pump as set forth in claim 2 and further comprising piston biasing means for biasing the piston to the first position.

4. The apparatus for switching the suction system for a vacuum pump as set forth in claim 3 wherein the biasing force of the piston biasing means is adjustable.

5. The apparatus for switching the suction system for a vacuum pump as set forth of claim 1, wherein the predetermined value of the difference between the pressure in at least the said one of the first and second passages and the pressure chamber is adjustable when the pilot valve actuates.

6. The apparatus for switching the suction system for a vacuum pump as set forth in claim 1 wherein the first and second passages are directly coupled with each other.

* * * * *